United States Patent [19]
Palara

[11] Patent Number: 5,521,414
[45] Date of Patent: May 28, 1996

[54] MONOLITHIC INTEGRATED STRUCTURE TO PROTECT A POWER TRANSISTOR AGAINST OVERVOLTAGE

[75] Inventor: Sergio Palara, Acitrezza, Italy

[73] Assignee: SGS-Thomson Microelectronics s.r.l., Milan, Italy

[21] Appl. No.: 234,334

[22] Filed: Apr. 28, 1994

[30] Foreign Application Priority Data

Apr. 28, 1993 [EP] European Pat. Off. .............. 93830180

[51] Int. Cl.[6] .......................... H01L 23/62; H01L 29/76; H01L 29/00; H01L 27/082
[52] U.S. Cl. ......................... 257/355; 257/328; 257/356; 257/502; 257/551; 257/577
[58] Field of Search ...................................... 257/355, 356, 257/362, 328, 500, 502, 552, 603, 551, 577, 341

[56] References Cited

FOREIGN PATENT DOCUMENTS

| 0292782 | 11/1988 | European Pat. Off. ............... 257/341 |
| 0296675 | 12/1988 | European Pat. Off. ............... 257/355 |
| 4122347 | 2/1992 | Germany .................................. 257/328 |
| 55-68669 | 5/1980 | Japan ...................................... 257/577 |
| 59-198768 | 11/1984 | Japan ...................................... 257/603 |
| 63-301555 | 12/1988 | Japan ...................................... 257/577 |

OTHER PUBLICATIONS

Annex of European Search Report (Examiner Fransen L. J. L., Search Completed Oct. 05,1993) Regarding EP-A-0296675, note Patent family members US-A-4736271 and JP-A-1033957; similarly regarding EP-A-0292782, note Patent family members JP-A-6329279, DE-A-3878037 and US-A-4931846).

*Primary Examiner*—Steven H. Loke
*Attorney, Agent, or Firm*—David V. Carlson; Seed and Berry

[57] ABSTRACT

A structure of an electronic device having a predetermined unidirectional conduction threshold is formed on a chip of an N-type semiconductor material and includes a plurality of isolated N-type regions. Each isolated N-type region is bounded laterally by an isolating region and at the bottom by buried P-type and N-type regions which form in combination a junction with a predetermined reverse conduction threshold and means of connecting the junctions of the various isolated regions serially together. The buried N-type region of the first junction in the series is connected to a common electrode, which also is one terminal of the device, over an internal path of the N-type material of the chip, and the buried P-type region of the last junction in the series contains an additional buried N-type region which is connected electrically to a second terminal of the device.

14 Claims, 2 Drawing Sheets

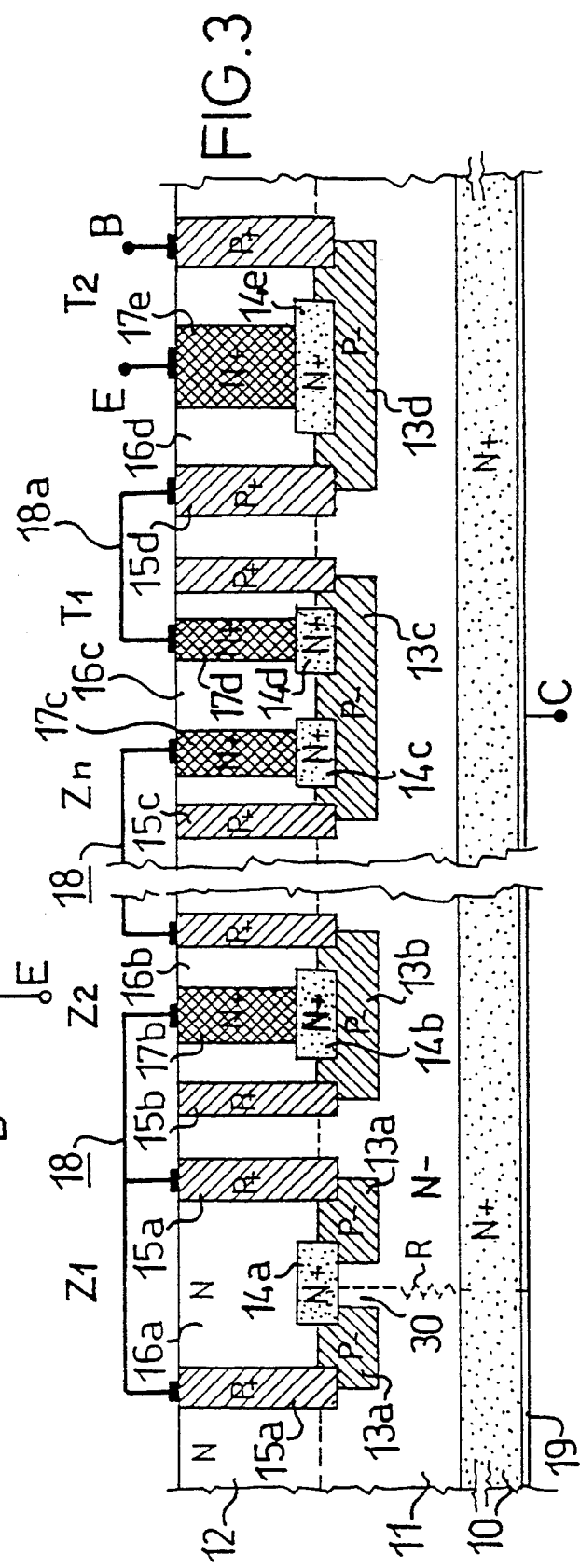

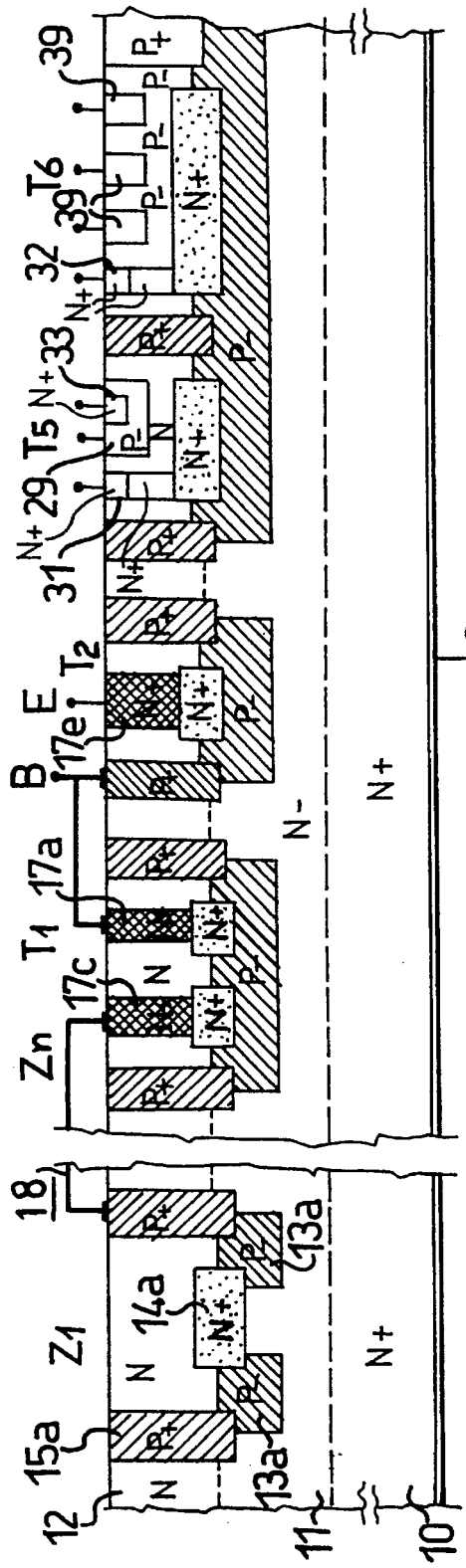
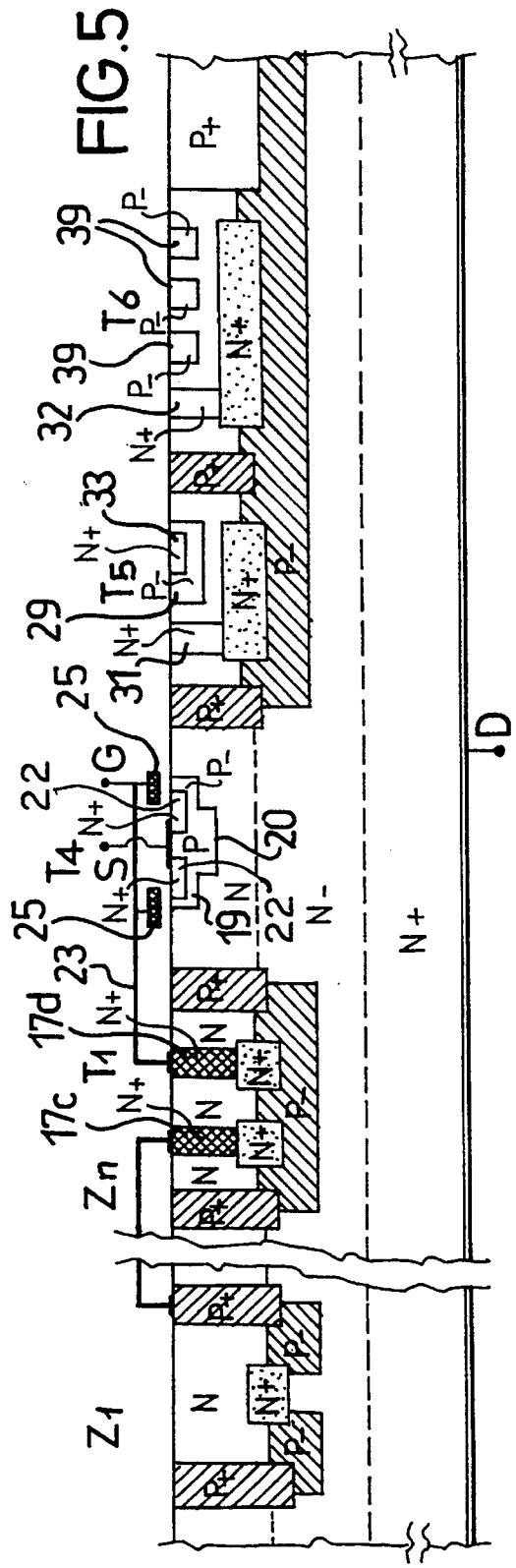

MONOLITHIC INTEGRATED STRUCTURE TO PROTECT A POWER TRANSISTOR AGAINST OVERVOLTAGE

TECHNICAL FIELD

This invention relates to monolithic semiconductor integrated circuit structures, and in particular to a device having a predetermined unidirectional conduction threshold which is especially adapted to protect a power transistor integrated to said structure against overvoltages.

BACKGROUND OF THE INVENTION

Transistors, whether of the bipolar or field-effect types, are frequently used as switches to supply a load with switching currents which may be quite large. Especially where the transistor load is an inductive one, the switch breaking, that is the sudden transition from the conduction state to the cutoff state of the transistor, brings about a transient situation of overvoltage across the power terminals of the transistor, that is between its collector and emitter in the instance of a bipolar transistor or between its drain and source terminals in the instance of a field-effect transistor. This overvoltage may be several times higher than the transistor supply voltage and attain such values and durations as to exceed safe limits set by the structural characteristics of the transistor, to the point that the transistor may be destroyed.

A known practice for protecting a bipolar transistor in such circumstances is to connect, between the collector and the base of the transistor, a device with a predetermined unidirectional conduction threshold, such as a Zener diode having a lower reverse breakdown voltage than the breakdown voltage between the transistor collector and emitter, with the base open or floating, referred to as $BV_{ceo}$. As the collector/emitter voltage increases due to the transition from the conduction to the cutoff state up to the reverse conduction value of the Zener, a current is injected into the transistor base. The latter is, therefore, restored to conduction and discharges the energy stored in the inductive load on itself. Of course, the transistor should be sized to absorb such energy harmlessly. The maximum overvoltage between the collector and the emitter would equal here the breakdown or reverse conduction threshold voltage of the Zener diode plus the transistor base/emitter/forward voltage.

A similar device to the above-described one is used to protect a field-effect power transistor, such as a vertical MOSFET, against overvoltages across the source and drain terminals. But in this case the structure is somewhat different, because a diode with opposite polarity from that of the Zener diode must be connected in series with the Zener diode connected between the gate and drain terminals. In fact, the gate terminal voltage may exceed by some 10–15 volts the drain terminal voltage in normal operation of the transistor, so that a Zener diode connected directly between the gate and the drain would disallow such operating conditions because it would be in forward conduction the very moment that the gate/drain voltage exceeds the forward conduction threshold (typically 0.7 volts at the silicon) of the Zener diode.

It is recognized that, to provide a protection device of the aforesaid kind, one may use, for the predetermined conduction threshold component, an open-base bipolar transistor connected between the emitter and the collector by utilizing the base punch-through effect, or use a diode which, while not being operated on Zener's effect, has a conduction characteristic similar to that of a Zener diode, i.e. a non-destructive reverse breakdown voltage having a predetermined threshold, like most of the diodes including an avalanche reverse breakdown junction.

If necessary, instead of a single Zener diode or its equivalent, there may be connected in series several, until the desired threshold voltage for protection is attained. The need for this may arise where the protection device is to be implemented in a monolithic integrated structure within a well-defined manufacturing process that ideally should not be altered by the addition of specific steps directed to form a diode with the reverse breakdown characteristics sought; that is, it is preferred to connect in series several junctions which can be easily obtained by the standard process. In this case, however, the serial resistance of the protection device in conduction may be comparatively high, which is apt to impair the protection effectiveness, especially where the transistor to be protected is a bipolar one.

To obviate this problem, it has been known to use an additional bipolar transistor serving as a current amplifier. That transistor, as shown at T1 in FIG. 1 of the accompanying drawings, has its collector in common with the collector of the transistor to be protected; the latter being in this example the power transistor T2 of an NPN Darlington pair whose drive transistor is designated T3. Further, the transistor T1 has its emitter connected to the base of the power transistor T2 and its base connected to the anode of the first Zener diode Zn in a chain of n Zener diodes Z1, Z2 . . . , Zn connected, with the other end, to the common collectors of the transistors.

An integrated protection device useful especially with a MOSFET transistor is disclosed in German Patent Application DE 4,122,347. The circuit diagram of that device is shown in FIG. 2 of the accompanying drawings applied to an N-channel MOSFET transistor indicated at T4. The component with Zener diode function, i.e. with predetermined reverse breakdown unidirectional conduction, is represented there by a series of n Zener diodes Z1, Z2 . . . Zn to indicate that it is formed from n junctions connected serially together. Thus, an overall breakdown or reverse conduction voltage is obtained which is a multiple of that to be obtained with a single junction formed by the particular manufacturing process adopted. As may be seen, provided in series with the diodes Z1–Zn is a diode D1 connected in reverse polarity with respect to the Zener diodes in order to inhibit forward conduction between the gate G and the drain D. However, that prior structure cannot provide accurate and repeatable reverse conduction threshold voltages because the junctions of the component diodes are formed between diffused regions, and accordingly, do not have reverse breakdown voltages that can be accurately predicted. In addition, its dimensioning is fairly critical due to the risk of parasitic effects between components of the device, and is unsuited to applications where the protection device is integrated along with control circuits for the power transistor to be protected.

SUMMARY OF THE INVENTION

It is the object of this invention to provide a monolithic integrated structure of a predetermined unidirectional conduction threshold device, particularly for protecting a power transistor, wherein the threshold voltage can be defined accurately and repeatably, wherein optimum isolation from the other circuit components can be provided, and which can be integrated without having recourse to additional steps, along with a power transistor and associated control circuit.

In the preferred embodiment of the present invention, this and other objects are achieved by the structures described in detail below. These objects can be more clearly understood from the following detailed description of an exemplary, and in no way limitative, embodiment of the present invention.

BRIEF DESCRIPTION OF THE DRAWINGS

FIG. 1 illustrates a circuit diagram of a bipolar device which can be implemented in integrated structures according to the invention.

FIG. 2 illustrates a circuit diagram of a MOSFET device which can be implemented in integrated structures according to the present invention.

FIGS. 3, 4 and 5 are sectional views of three integrated structures according to the invention.

DETAILED DESCRIPTION OF THE INVENTION

The structure shown in FIG. 3 reproduces the circuit of FIG. 1 in integrated form on a chip of a semiconductor material such as monocrystalline silicon. It is advantageously formed by a manufacturing process as described in Italian Patent Application No. MI91A003159 filed by the Applicant and called "VIPower", an Applicant's trade mark. That process is specially directed to provide integrated structures comprising power transistors and signal processing circuits for controlling power transistors. The drive transistor T3 of the Darlington pair has been omitted from FIG. 3 of the drawings for simplicity; in practice, it would have a similar configuration to that of the power transistor T2.

The structure is formed, through conventional steps of the VIPower process, on a monocrystalline silicon substrate 10 which is heavily doped with impurities of the N type. In the drawings, the relative concentrations of impurities of the N and P types are customarily indicated by placing "−" and "+": symbols behind the characters N and P tier light or heavy concentrations respectively; characters N and P carrying no "−" or "+" suffix denote concentrations at intermediate values. Formed on the substrate 10 by epitaxial growth is a first layer 11 having the same type of N conductivity but a lower concentration of impurities. On the surface of the epitaxial layer 11 there are implanted regions of the P type (13a–d) having a comparatively low concentration of impurities, and subsequently, regions of the N type (14a–e) having a high concentration of impurities substantially within the P-type regions (13a–d). A second layer 12 of the N type having a higher concentration of impurities than the first layer 11 is formed on the layer 11 by epitaxial growth. In this step, which is carried out at a high temperature, the implanted regions of the P type and N type extend by diffusion through the two epitaxial layers to create buried regions denoted in the drawing by 13a–d and 14a–e, respectively. Formed then in the second layer 12 by conventional masking and diffusing techniques, are P-type regions having a high concentration of impurities, as shown at 15a–d, which extend through the second epitaxial layer 12 and partway penetrate the first layer 11 to join the regions 13a–d, as shown in FIG. 3. Notice that the regions 15a–d are shaped as elongated rectangles and will, therefore, bound mutually isolated portions of the second epitaxial layer 12. More specifically, these mutually isolated portions of the second epitaxial layer 12 are closed at the bottom by the regions 13a–d and 14a–e, thereby form a plurality of N- type wells 16a–d: each of the plurality of N-type wells being isolated from every other N-type well. Using similar techniques, N-type regions 17b–e having a high concentration of impurities and which are extended to join some of the buried regions 14a–e of the N type, such as buried regions 14b–e as shown in the example of FIG. 3, are then formed within some of the wells 16a–d, such as wells 16b–d as shown in the example of FIG. 3. More specifically, N-type region 17b extends within N-type well 16b to join with buried N+ region 14b. Similar N-type regions 17c and 17d extend within N-type well 16c to join buried N+ regions 14c and 14d, respectively. Finally, N-type region 17e extends within N-type well 16d to join with buried N+ region 14e.

Metallic paths are then formed using conventional deposition, masking, and etching techniques to selectively interconnect, by an ohmic contact on the large surface of the silicon chip thus formed, the regions 15a–d and 17b–d, and provide further connections and metallized areas of ohmic contact, such as those indicated at E and B in the drawing. The free surface of the substrate is also covered with a metallic layer 19 which constitutes a terminal, indicated at C, shared in common by several device components.

The resultant structure includes the power transistor T2, being a vertical NPN bipolar transistor which has the common terminal C as its collector terminal, the terminal E contacting the region 17e which establishes a deep contact with the buried region 14e of the N type as its emitter terminal, and the terminal B contacting the buried region 13d of the P type through the isolating region 15d of the P type as its base terminal. The buried region 13d and the buried N-type region 14e form the base emitter junction of the transistor. Similarly, buried region 13d and the first epitaxial layer 11 form the base collector junction of the transistor.

In the drawing, the power transistor T2 is represented as a single element formed in one of the wells 16a–d; for example, the example of FIG. 3 shows that T2 may be formed in well 16d. In actual practice, however, it would be frequently composed of a number of elements, equal to that shown and connected together in parallel.

The chain of Zener diodes Z1–Zn in FIG. 1 is implemented in the structure of FIG. 3 as a series of junctions between buried regions 13a–c of the P type and buried regions 14a–c of the N type, each having a predetermined breakdown, or reverse conduction threshold, voltage. The individual junctions are interconnected together by joining opposite type regions of different junctions such that the anode of each basic diode is connected to the cathode of the next; thus, the voltage at which the diode chain reverse conduction will occur is given by the sum of the breakdown voltages of the individual junctions.

Notice that, in a specially advantageous embodiment of the invention, the cathode of the first element Z1 in the chain, i.e., the buried region 14a of the N type, is connected to the common terminal C, directly to the structure interior through an aperture 30 in the respective buried region 13a of the P type. This is, therefore, a resistive connection, denoted by R, through the first epitaxial layer 11 and the substrate 10.

The elemental diodes after the first (Z1) use, for cathode connection, each a deep contact region 17b,c of the N type and a section of metallic surface path 18 in contact with the surface of the P type region 15a,b of its preceding diode. Shown at Z2 in the drawing is just one of those intermediate diodes. It is understood that the number of the diodes like Z2 is determined by the value of the overall reverse conduction threshold voltage sought. As an example, in a practical embodiment of the structure, each of the four diodes individually provides a reverse conduction voltage of 85 volts.

The last of the elemental diodes, indicated at Zn, has no external electric connection between its anode and the remainder of the circuit, i.e. the base of the additional transistor T1, but is integrated into a single structure with the latter. Specifically, the transistor T1 is implemented using the P-type region 13c for the base of the transistor. The P-type region 13c also forms the anode of the diode Zn. Moreover, the P-type region 13c, in conjunction with N-type region 14d, forms the base emitter junction of transistor T1. The emitter contact is provided by an additional deep region 17d of the N type, and the collector contact is the common terminal C. One of the paths 18, denoted by 18a, joins the emitter of transistor T1 to the base of the power transistor T2.

Both buried regions of the N type, 14c and 14d, which form the cathode of diode Zn and the emitter of transistor T1, have the same concentration of impurities. In the preferred embodiment of the present invention, these regions are formed using the steps of the VIPower process. If necessary and in view of the current required to drive the power transistor T2, however, the horizontal extent or area of the emitter region 14d, 17d of T1 may conveniently be greater than that of the cathode region Zn 14c, 17c.

An advantageous feature of the inventive structure is that all the junctions of the diode Z1–Zn are formed by implanted regions (13a–c and 14a–c), so that the reverse conduction threshold can be set with great accuracy and is little affected by normal fluctuations in the process parameters, as against prior structures which employ junctions between regions doped by deposition and diffusion which, as is recognized, produce breakdown voltages tightly dependent on the process parameters.

Another advantageous feature is that all the junctions of the protection device but that of the first diode Z1 are completely isolated from one another and from other components because they are buried junctions contained within isolated wells. Thus, no parasitic effects occur which may detract from the protection effectiveness. The one partial departure from this isolated condition concerns the first junction in the diode chain Z1–Zn which, however, is no cause of harmful parasitic effects and represents an effective way of connecting the cathode of said first diode to the common terminal C.

As mentioned, the above-described protection device is made using standard steps of the VIPower process for manufacturing complex structures comprising a power component and a low-voltage control circuit for the power component. An example of a structure of this kind is illustrated by FIG. 4, where along with a bipolar power transistor T2 and a protection device like that just described, there are shown two typical components of a control circuit, namely a low-voltage vertical NPN transistor T5 and a lateral PNP transistor T6. As can be seen, the epitaxial wells bound by the P-type buried regions and the P-type isolation regions of the transistors are formed by the same process steps as are required to form the similar epitaxial wells containing the junctions of the diode Z1–Zn. Additional masking and doping steps are provided to jointly form the base region 29 of the bipolar transistor T5, the emitter and collector regions 39 of the lateral PNP transistor T6, the joint formation of the deep collector contact 31 of the bipolar transistor T5 and the deep base contact 32 of the lateral transistor T6, as well as the emitter 33 of the vertical transistor T5.

Shown in FIG. 5 is an integrated structure wherein a protection device according to the invention is applied to a vertical construction, N-channel MOSFET power transistor T4.

The manufacturing process is the same as that described above in connection with the bipolar structure, up to and including the step of diffusing the regions 17b–e of the N type. Subsequently, a P-type region, shown at 20 in FIG. 5, is implanted and diffused which constitutes the deep body of the transistor T4. The gate electrode 25 of polycrystalline silicon is formed next which is isolated from the chip surface by an appropriate gate dielectric, not shown. Then a P-type region 19 is formed, with a lower impurity concentration than that of region 20, to provide the transistor body. During the last-named step, the base regions of any low-voltage vertical NPN bipolar transistors T5 and the emitters and collectors of any lateral PNP transistors T6 are also formed. N-type regions 22 are then formed which constitute the source of the MOSFET transistor, and formed simultaneously therewith are the emitter regions 33 of the low-voltage NPN transistors. A metallic connection path 23 is finally formed along with the interconnection paths for the protection device, as described already in relation to FIG. 3, in order to connect the gate electrode 25 to the emitter or the additional transistor T1. The drain electrode D is coincident with the common terminal C of the structure.

The circuit diagram representing the above-described structure is similar to that of FIG. 2, where the diode D1 constitutes the emitter junction of transistor T1.

While one embodiment of the invention has only been described, it will be appreciated that several changes and modifications may be made thereto within the scope of the same inventive concept. As an example, the predetermined unidirectional conduction threshold device could include a single junction, rather than several junctions connected in series; in this case, the structure would include a single isolated well bound on the bottom by a P-type region shaped similar to the region 13a in FIG. 3 and having an additional buried region of the N type, such as the region 14a in that Figure. Therefore, in such an alternative embodiment as shown in FIG. 6, an N-type well 16a extends into the chip from the top surface and is bounded laterally on all sides by isolating P-type region 15a. The N-type well is bound at the bottom by a buried P-type region 13a and by a first buried N-type region 14a and a second buried N-type region 14e. The buried P-type region 13a and the first buried N-type region 14a together form a first p-n junction, and the buried P-type region 13a and the second buried N-type region 14e together form a second p-n junction. The buried P-type region 13a is joined to the isolating P-type region 15a. A first electric connection R connects the first buried N-type region 14a and a first terminal C of the device on the opposite surface of the chip from the top surface through an aperture 30 in the buried P-type region 13a. The first buried N-type region 14a is in contact with the N-type material 11 of the chip outside the isolated region, whereby the portion of the N-type material 11 included between the first N-type buried region 14a and the first terminal C of the device is a part of the first electric connection R. Deep contact N-type region 17e is a second electric connection extending from the top surface of the chip to the second N-type buried region 14e and connects the second buried N-type region 14e and a second terminal E of the device. It is understood, moreover, that complementary structures of that described may be provided using materials and regions of the P type instead of the N-type ones, and vice versa. Therefore, the metes and bounds of the present invention are limited only by the supplemental claims.

I claim:

1. An integrated structure of an electronic device having a predetermined unidirectional conduction threshold, which structure is formed on a chip of an N-type semiconductor material and comprises:

a plurality of N-type isolated regions extending into the chip from a first surface of the chip and being each bounded laterally by a P-type isolating region, and at the bottom, by a pair of buried regions of P-type and N-type which form a p-n junction therebetween, the P-type buried region of the pair being joined to the isolating region;

first means of electric connection between opposite-type regions of said pairs of buried regions, which connect respective p-n junctions serially together;

second means of electric connection between the N-type buried region of the buried region pair forming the first p-n junction in the series and a first terminal of the device;

the isolated region of said plurality of N-type isolated regions bounded at the bottom by the buried region pair which form the last p-n junction in the series comprising an additional buried region of the N-type which forms an additional p-n junction with the respective buried region of the P-type; and third means of electric connection between the additional buried region of the N-type and a second terminal of the device.

2. A structure according to claim 1 wherein the first terminal of the device is formed on a second surface of the chip opposite from said first surface; and the buried region of the P-type of the buried region pair forming the first p-n junction in the series is shaped such that the buried region of the N-type forming a p-n junction therewith is in contact with an N-type material portion of the chip outside its respective isolated region, whereby the N-type material portion included between that buried region of the N-type of the first p-n junction in the series and the first terminal of the device is a part of the second connection means.

3. A structure according to claim 2 wherein the first connection means comprise deep contact regions of the N-type each extending from the first surface of the chip to the buried region of the N-type of each of the buried region pairs, with the exception of the buried region pair which forms the first p-n junction in the series; and the third means of connection comprise an additional deep contact region of the N-type extending from the first surface of the chip to the additional buried region of the N-type.

4. A structure according to claim 1 wherein the first connection means comprise metallic paths extending across the first surface of the chip, said metallic paths being in ohmic contact with selected surface areas of the P-type isolation regions and with selected surface areas of N-type deep contact regions extending from the first surface of the chip to the buried region of the N-type of each of the buried region pairs, with the exception of the buried region pair which forms the first p-n junction in the series; and the third connection means comprise an additional metallic path in ohmic contact with a selected surface area of an additional deep contact region of the N-type extending from the first surface of the chip to the additional buried region of the N-type.

5. A protection device against overvoltages between the collector and the emitter terminals of a bipolar power transistor, integrated to a structure as claimed in claim 1 wherein said first and second terminals are the terminals of the protection device and are respectively connected to the collector terminal and the base terminal of the bipolar power transistor.

6. A protection device against overvoltages between the drain and the source terminals of a field-effect power transistor, integrated to a structure as claimed in claim 1 wherein said first and second terminals are the terminals of the protection device and are respectively connected to the drain and the gate terminals of the field-effect power transistor.

7. An integrated structure of an electronic device having a predetermined unidirectional conduction threshold formed on a chip of an N-type semiconductor material, comprising:

an isolated region of the N-type extending into the chip from a first surface of the chip and being bounded laterally by an isolating region of the P-type and at the bottom by a buried region of the P-type and by first and second buried regions of the N-type which form, together with the buried region of the P-type, first and second p-n junctions, respectively, the buried region of the P-type being joined to the isolating region;

a first electric connection between the first buried region of the N-type and a first terminal of the device; and a second electric connection between the second buried region of the N-type and a second terminal of the device.

8. A structure according to claim 7 wherein the first terminal of the device is formed on the opposite chip surface from said first surface; and the buried region of the P-type is shaped such that the first buried region of the N-type is in contact with an N-type material portion of the chip outside the isolated region, whereby the portion of the N-type material included between said first buried region of the N-type and the first terminal of the device is a part of the first electric connection.

9. A structure according to claim 8 wherein the second electric connection comprises a deep contact region extending from the first surface of the chip to the second buried region of the N-type.

10. An integrated circuit structure formed on a chip having a substrate of a first conductivity type, the structure comprising:

a plurality of isolated regions of the first conductivity type, each of said isolated regions extending into said chip from a first surface of said chip, each of said isolated regions being bounded laterally by an isolating region of a second conductivity type, each of said isolated regions being bounded at a bottom of said isolated region by a pair of buried regions, said pair of buried regions having a buried region of said first conductivity type and a buried region of said second conductivity type, said pair of buried regions forming a junction therebetween, said buried region of second conductivity type being joined to said isolating region;

first electrical connection means that electrically connect said junctions in series, such that said buried regions of said first conductivity type are electrically connected to said buried regions of said second conductivity type;

second electrical connection means that electrically connect a buried region of said first conductivity type in a first junction in said series of junctions and a first terminal of said circuit structure;

an additional buried region of said first conductivity type, said additional buried region being buried in the isolated region of said first conductivity type bounded at the bottom by the buried region pair forming the last junction in said series of junctions, said additional buried region forming an additional junction with the buried region of said second conductivity type forming the last junction in said series of junctions; and third electrical connection means between said additional buried region of said first conductivity type and a second terminal of said circuit structure.

11. The structure of claim 10 wherein said first conductivity type comprises N-type semiconductor material and said second conductivity type comprises P-type semiconductor material.

12. The structure of claim 10 wherein said first conductivity type comprises P-type semiconductor material and said second conductivity type comprises N-type semiconductor material.

13. The structure of claim 10 wherein said first and second terminals are terminals of a protection device against overvoltages between collector and emitter terminals of a bipolar power transistor, said first terminal being connected to said collector terminal of said bipolar power transistor, said second terminal being connected to a base terminal of said bipolar power transistor.

14. The structure of claim 10 wherein said first and second terminals are terminals of a protection device against overvoltages between drain and source terminals of a field-effect power transistor, said first terminal being connected to said drain terminal of said field-effect power transistor, said second terminal being connected to a gate terminal of said field-effect power transistor.

\* \* \* \* \*

UNITED STATES PATENT AND TRADEMARK OFFICE
CERTIFICATE OF CORRECTION

PATENT NO.  : 5,521,414
DATED       : May 28, 1996
INVENTOR(S) : Sergio Palara

It is certified that error appears in the above-indentified patent and that said Letters Patent is hereby corrected as shown below:

On the title page, item:

[73] Assignee:   CO.RI.M.ME. CONSORZIO PER LA RICERCA SULLA
                 MICROELETTRONICA NEL MEZZOGIORNO
                 Catania, ITALY Signed and Sealed this Eighth Day of October, 1996

Attest:

BRUCE LEHMAN

Attesting Officer     Commissioner of Patents and Trademarks